(12) United States Patent
Morikawa et al.

(10) Patent No.: US 9,905,448 B2
(45) Date of Patent: Feb. 27, 2018

(54) ARTICLE TRANSPORT FACILITY

(71) Applicant: Daifuku Co., Ltd., Osaka-shi (JP)

(72) Inventors: Yasushi Morikawa, Hinocho (JP); Toshihito Ueda, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 67 days.

(21) Appl. No.: 15/091,783

(22) Filed: Apr. 6, 2016

(65) Prior Publication Data

US 2016/0293468 A1 Oct. 6, 2016

(30) Foreign Application Priority Data

Apr. 6, 2015 (JP) ................................ 2015-077898

(51) Int. Cl.
| | | |
|---|---|---|
| *G06F 7/00* | (2006.01) | |
| *H01L 21/677* | (2006.01) | |
| *H01L 21/67* | (2006.01) | |
| *B65G 1/137* | (2006.01) | |

(52) U.S. Cl.
CPC .. *H01L 21/67769* (2013.01); *H01L 21/67276* (2013.01); *B65G 1/137* (2013.01); *B65G 2201/0297* (2013.01); *B65G 2207/40* (2013.01)

(58) Field of Classification Search
None
See application file for complete search history.

(56) References Cited

U.S. PATENT DOCUMENTS

| | | | | |
|---|---|---|---|---|
| 3,813,202 | A * | 5/1974 | Rossler | B28B 15/00 |
| | | | | 425/305.1 |
| 6,347,990 | B1 * | 2/2002 | Sung | H01L 21/67017 |
| | | | | 414/217 |
| 2002/0025244 | A1 * | 2/2002 | Kim | H01L 21/67775 |
| | | | | 414/217 |
| 2010/0040444 | A1 | 2/2010 | Hanel | |
| 2015/0346708 | A1 * | 12/2015 | Mattern | G05B 19/19 |
| | | | | 700/114 |

FOREIGN PATENT DOCUMENTS

| | | |
|---|---|---|
| JP | 6340310 A | 12/1994 |
| JP | 2010523439 A | 7/2010 |
| JP | 5170825 B2 | 3/2013 |

* cited by examiner

*Primary Examiner* — Yolanda R Cumbess
(74) *Attorney, Agent, or Firm* — The Webb Law Firm

(57) ABSTRACT

When a transport start condition, which includes at least a condition that the controller is receiving a closed state signal, is satisfied, a controller allows a transport operation by an article transport device, and suspends the transport operation by the article transport device when the controller stops continually receiving the closed state signal after the transport operation by the article transport device is started, and further, allows the transport operation by the article transport device to continue while the controller is receiving the closed state signal after the transport operation by the article transport device is started, even if an object to be detected is detected by a monitoring detector.

4 Claims, 6 Drawing Sheets

ARTICLE TRANSPORT FACILITY

CROSS-REFERENCE TO RELATED APPLICATION

This application claims priority to Japanese Patent Application No. 2015-077898 filed Apr. 6, 2015, the disclosure of which is hereby incorporated in its entirety by reference.

FIELD OF THE INVENTION

The present invention relates to an article transport facility that comprises an article transport device configured to move along a travel path defined in transport space to transport an article, a partition for separating the transport space from work space for a worker to work and defined adjacent the transport space, an opening provided in the partition for allowing the work space and the transport space to communicate, an opening and closing member which can be switched between a closed state for closing the opening and an open state for leaving the opening open, a monitoring detector for detecting presence of an object to be detected that has entered an monitored area, the monitoring detector being provided at a position for monitoring the monitored area which is adjacent the opening and on a side of the work space relative to the opening along a direction along which the transport space and the work space are adjacent each other, a closed state detector which outputs a closed state signal when the opening and closing member is in the closed state, and a controller for controlling transport operation of the article transport device.

BACKGROUND

Examples of conventional article transport facilities include one described in JP Patent No. 5170825 (Patent Document 1) in which a transport operation of the article transport device is allowed to be started and continued when two conditions are satisfied, namely, a condition that the opening and closing member is closed (referred to hereinafter as the first condition) and a condition that the monitoring detector (for example, a light curtain etc.) has not detected any object to be detected (referred to hereinafter as the second condition).

SUMMARY OF THE INVENTION

In the case of Patent Document 1, the first and second conditions need to be satisfied in order for any transport operation to be continued. Thus, even if the opening and closing member is closed, an emergency stop of the transport operation of the article transport device is carried out when the monitoring detector detects any object to be detected. With the opening and closing member closed, the detected object cannot enter the transport space side from the work space side through the opening even if the monitoring detector detects any object; thus, safety is secured.

Therefore, with the opening and closing member closed, the monitoring detector causing an emergency stop of the transport operation of the article transport device to be carried out based on the detected information means that the emergency stop of the transport operation of the article transport device is carried out despite the fact that safety is secured, resulting in redundant safety measures.

Thus, in the article transport facility of Patent Document 1, redundant safety measures are taken at the expense of transporting efficiency of the article transport facility.

Further, some facilities adopt a program in which, from a viewpoint of safety, when the article transport device makes an emergency stop, the transport operation cannot be resumed until a worker issues a resumption allowing signal after checking to make sure that safety is secured. In such article transport facilities, transporting efficiency falls further because resumption of the transport operation after an emergency stop takes additional time.

Therefore, an article transport facility is desired in which any decrease in transporting efficiency is reduced while ensuring the safety of the facility.

In light of the above, an article transport facility comprises: an article transport device configured to move along a travel path defined in transport space to transport an article; a partition for separating the transport space from work space for a worker to work and defined adjacent the transport space; an opening provided in the partition for allowing the work space and the transport space to communicate; an opening and closing member which can be switched between a closed state for closing the opening and an open state for leaving the opening open; a monitoring detector for detecting presence of an object to be detected that has entered an monitored area, the monitoring detector being provided at a position for monitoring the monitored area which is adjacent the opening and on a side of the work space relative to the opening along a direction along which the transport space and the work space are adjacent each other; a closed state detector which outputs a closed state signal when the opening and closing member is in the closed state; and a controller for controlling transport operation of the article transport device.

The controller: allows a transport operation by the article transport device to be started when a transport start condition which includes at least a condition that the controller is receiving the closed state signal is satisfied; and suspends the transport operation by the article transport device when the controller stops receiving the closed state signal after the transport operation by the article transport device is started; and allows the transport operation by the article transport device to continue while the controller is receiving the closed state signal after the transport operation of the article transport device is started even if the monitoring detector detects an object to be detected.

When the controller is not receiving the closed state signal, that is, when there is a possibility that the opening and closing member may no longer be in the closed state, there is a possibility that opening may be left open and an intruding object may enter the transport space through the opening. Because the transport operation by the article transport device is stopped when that happens, even if an intruding object enters the transport space through the opening during the transport operation by the article transport device, any incident of the entering intruding object interfering with or contacting the article transport device can be avoided. Note that when some member (e.g. controller) is not receiving the closed state signal, this includes a situation where the closed state signal is not outputted by the closed state detector due to a malfunctioning, etc., despite the fact that the opening and closing member is in the closed state.

In addition, when the controller is receiving the closed state signal, that is, when the opening and closing member is in the closed state, there would be no possibility of an intruding object entering the transport space through the opening. Thus, even if an object to be detected is detected by the monitoring detector, it would not be possible for the detected object to enter the transport space through the opening as an intruding object. Therefore, even after an object to be detected is detected by the monitoring detector, the safety of the facility is secured even if the transport operation by the article transport device is allowed to continue.

Thus, when the opening and closing member is in the closed state, by allowing the transport operation by the article transport device to be continued even if an object to be detected is detected by the monitoring detector, the transport operation by the article transport device would not be stopped more often than necessary. As a result, any decrease in the transporting efficiency of the article transport device can be reduced.

As such, the present invention can provide an article transport facility in which any decrease in transporting efficiency is reduced while ensuring the safety of the facility.

DETAILED DESCRIPTION

Figure 1:
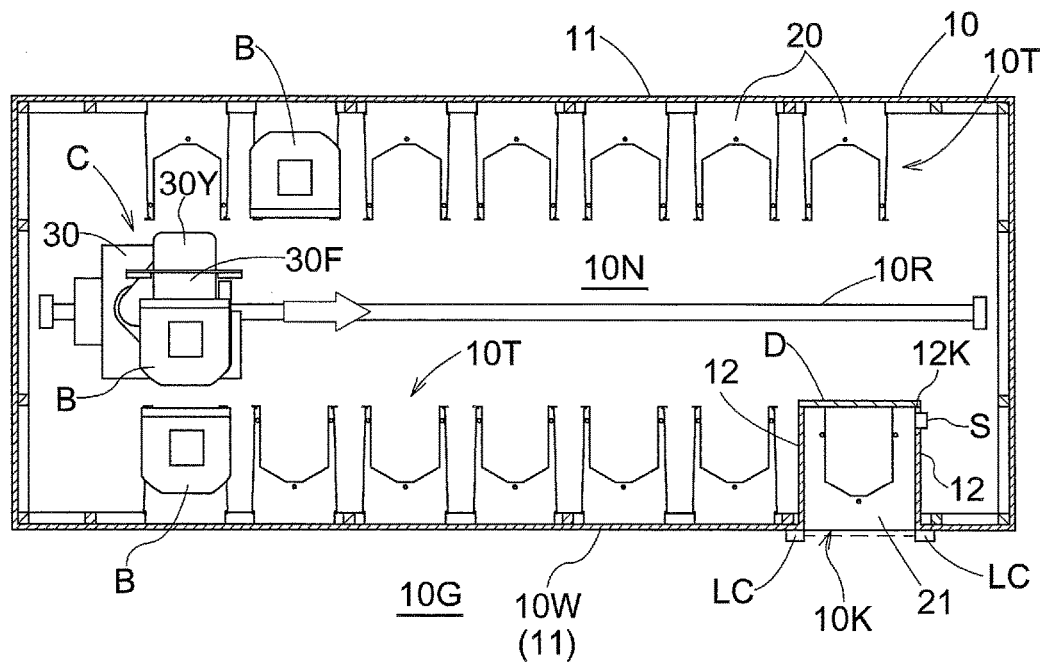
FIG. 1 is a diagrammatic plan view of a semiconductor container storage and of how a movement control is performed.

Embodiments are described next in which an article transport facility of the present invention is applied to a semiconductor container storage with reference to the drawings. As shown in FIG. 1, the semiconductor container storage 10 includes a stacker crane C (which is an example of an article transport device) which moves along a travel rail 10R to transport articles one article at a time, and a storage rack 10T which has support bodies 20 each for supporting a container B (an example of an article), with the support bodies arranged along a vertical direction and along a direction parallel to the travel path. In the present embodiment, the travel rail 10R defines the travel path of the stacker crane C.

The stacker crane C includes a travel member 30 configured to travel on and along the travel rail 10R, a vertically movable member configured to be vertically moved along a vertical movement mast provided to the travel member 30 to stand vertically thereon, and a transfer device 30Y supported by the vertically movable member and configured to transfer a container B to and from a transfer target location located laterally along a direction perpendicular to the traveling direction of the travel member 30. In the following description, the direction parallel to the moving direction of the travel member 30 is referred to as the right and left direction whereas the direction perpendicular to the moving direction of the travel member 30 in plan view is referred to as the width direction. The transfer device 30Y includes a transfer support member 30F for supporting a container B such that the transfer support member 30F can be projected and retracted along the width direction between a retracted position and a projected position. The retracted position is a position that overlaps with the travel member 30 in plan view. The projected position is a position displaced laterally of the travel path along the width direction relative to the retracted position. And the transfer device 30Y is configured to transfer a container B to and from a transfer target location with a projecting and retracting operation of the transfer support member 30F to and from the transfer target location, with the travel member 30 stopped. The expression "with a projecting and retracting operation of the transfer support member 30F to and from the transfer target location" means that the container B is transferred to or from the transfer target location as a result of at least the transfer device 30Y performing the projecting and retracting operation of the transfer support member 30F. In other words, in the present embodiment, a container B is transferred to or from a transfer target location through a projecting and retracting operation of the transfer support member 30F by the transfer device 30Y in collaboration with a vertical movement operation of the vertically movable member; and, the transfer device 30Y may be configured under the assumption that an article is transferred in collaboration with a vertical movement of the vertically movable member.

In the present embodiment, the semiconductor container storage 10 is surrounded by surrounding walls 11 that forms a rectangle in plan view. In the following description, the space surrounded by the surrounding walls 11 is referred to as transport space 10N. Work space 10G for a worker to work in is defined on the other side of and beyond a wall portion 10W of the surrounding walls 11 that is one of the pair of wall portions that extend along the travel rail 10R.

Figure 2:
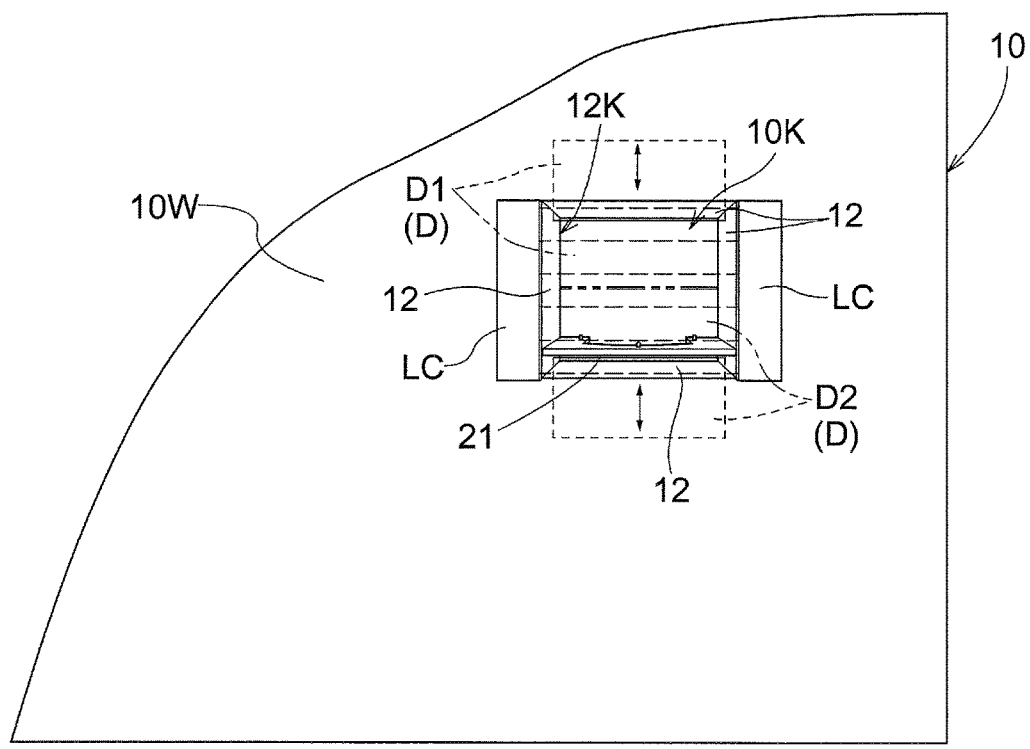
FIG. 2 is an enlarged view showing principal portions of an opening and an opening and closing member.

As shown in FIGS. 1 and 2, an entrance 10K is formed in the wall portion 10W. And a tubular member 12 extends into the transport space 10N from the entrance 10K. In the present embodiment, the wall portion 10W and the tubular member 12 extending from the entrance 10K define, or correspond to, the partition. And an opening 12K is formed in the end of the tubular member 12 on the side of the transport space 10N.

In addition, an opening and closing member D which can be switched between a closed state for closing the opening 12K and an open state for leaving the opening 12K open. The opening and closing member D is divided into two parts in the vertical direction. The upper opening and closing member D1 can be moved upwardly from the closed state whereas the lower opening and closing member D2 can be moved downward from the closed state. And the opening and closing member D1 and the opening and closing member D2 are moved toward each other to move or place them into the closed state whereas the opening and closing member D1 and the opening and closing member D2 are moved away from each other to move or place them into the open state.

A carrying-in-and-out support member 21 for carrying the container B in and out between the work space 10G and the transport space 10N is provided in an area that overlaps with the tubular member 12 in plan view. The carrying-in-and-out support member 21 is configured to allow a container B to be transferred to and from the transfer device 30Y and, in addition, to and from a transfer device of a manually operated transport carriage (not shown). In the present embodiment, the location in which the carrying-in-and-out support member 21 is provided is the carrying-in-and-out transfer location. And this carrying-in-and-out transfer location is defined in a monitored area described below.

In the present embodiment, the area that overlaps with the tubular member 12 in plan view exists on the side of, or closer to, the work space 10G relative to the opening 12K. Thus, as a transfer target location, the carrying-in-and-out transfer location is defined on the side of the work space 10G along the width direction and adjacent the opening 12K.

An open and closed state detector S is provided to the tubular member 12 and near the opening and closing member D. This open and closed state detector S outputs an open state signal when the opening and closing member D is in the open state, and outputs a closed state signal when the opening and closing member D is in the closed state. In addition, a light curtain LC is provided to the wall portion 10W on the side of the work space 10G relative to the entrance 10K. This light curtain LC detects any intruding object that has entered an area on the side of the transport space 10N relative to the entrance 10K. In the present embodiment, the open and closed state detector S is, or corresponds to the closed state detector and the open state detector. The light curtain LC is, or corresponds to, the monitoring detector. And an area containing a portion in which the light curtain LC can detect any intruding object is, or corresponds to, the monitored area.

That is, the light curtain LC and the open and closed state detector S of a limit-switch type are provided to the article storage facility. The light curtain LC detects presence of any object to be detected in the monitored area and is provided at a position for monitoring the monitored area adjacent the opening 12K and on the side of the work space 10G relative to the partition (the wall portion 10W and the tubular member 12) along a direction along which the transport space 10N and the work space 10G are adjacent each other. The open and closed state detector S outputs a closed state signal when the opening and closing member D is in the closed state, and outputs an open state signal when the opening and closing member D is in the open state.

Figure 3:
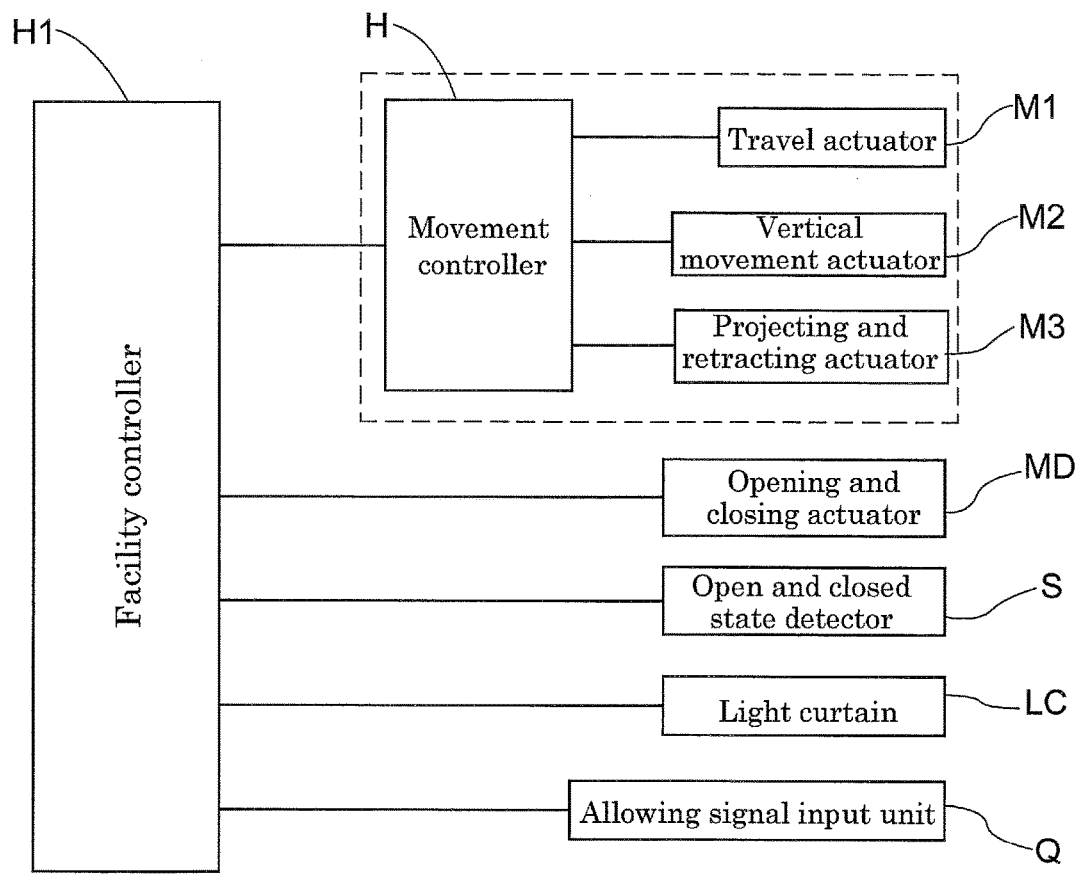
FIG. 3 is a control block diagram.

The control related configuration of the semiconductor container storage 10 is described next with reference to FIG. 3. A movement controller H provided in the stacker crane C is configured to control operation of a travel actuator M1 for moving the travel member 30, operation of a vertical movement actuator M2 for vertically moving, or raising and lowering, the vertically movable member, and operation of a projecting and retracting actuator M3 for projecting and retracting the transfer support member 30F of the transfer device 30Y. In addition, a facility controller H1 for overseeing and managing operating state of the semiconductor container storage 10 and for issuing commands to the movement controller H regarding the operation of the stacker crane C is fixedly provided in the work space 10G and near the semiconductor container storage 10. The movement controller H and the facility controller H1 can communicate with each other. The facility controller H1 is configured to manage the schedule of transporting of the containers B by the stacker crane C. In addition, the facility controller H1 is configured to command the movement controller H to cause the stacker crane C to perform an emergency stop and to resume its operation, based on information from sensors provided in corners of the semiconductor container storage 10. In addition, the movement controller H transmits to the facility controller H1 signals indicative of the operational state of the stacker crane C (i.e., a start and completion of a transport control, and a start and completion of transfer control, etc., described below).

Connected to the facility controller H1 are an opening and closing actuator MD for opening and closing the opening and closing member D, the open and closed state detector S, the light curtain LC, and an allowing signal input unit Q with which a worker can manually input a resumption allowing signal which indicates that the worker has allowed resumption of the transport operation. The facility controller H1 is configured to be able to issue an opening or closing command to the opening and closing actuator MD to cause it to open or close the opening and closing member D. In addition, the facility controller H1 is configured to detect, or otherwise receive, an open state signal and closed state signal from the open and closed state detector S, a detection signal indicative of a detected object from the light curtain LC, and a resumption allowing signal from the allowing signal input unit Q.

In the present embodiment, the movement controller H and the facility controller H1 are, or correspond to the controller.

That is, the controller is configured to perform an opening control for switching the opening and closing member D from the closed state to the open state as well as a closing control for switching the opening and closing member from the open state to the closed state.

Transport control for transporting of a container B by the stacker crane C in the present embodiment is described next with reference to the flowchart of FIG. 4.

The facility controller H1 issues a transport command to the movement controller H in accordance with the transport schedule for the container B (which includes transporting of the container B in accordance with a transport plan set in advance, and transporting of the container B based on the transport instructions given by a worker). And in the event that such command is issued ("Yes" at Step #1), the facility controller H1 determines if a closed state signal is received from the open and closed state detector S (Step #2). If the closed state signal is not received ("No" at Step #2), the subsequent operation of the stacker crane C is suspended until the closed state signal is received. If and when the closed state signal is received ("Yes" at Step #2), the facility controller H1 starts an LC disabling control for disabling detection of any object to be detected by the light curtain LC (Step #3). From that point on, detection of any object by the light curtain LC is disabled until an LC enabling control (Step #10) for enabling detection of any object to be detected by the light curtain LC is started. Note that the LC disabling control may be a control in which the light curtain LC is allowed to continue operating but, even if the light curtain LC outputs detection information, the detection information is ignored, or may be a control in which the operation of the light curtain LC itself is stopped.

If and when the LC disabling control is started, the movement controller H starts a movement control (Step #4) for causing the travel actuator M1 to operate to cause the travel member 30 to move or travel along the travel path to the carrying-in-and-out stop position defined in the travel path which is a stop position of the travel member 30 when it transfers a container B to or from the carrying-in-and-out transfer location by means of the transfer device 30Y. The movement controller H transmits a signal indicating that the movement control has been started, to the facility controller H1.

In the present embodiment, the fact that the facility controller H1 is receiving the closed state signal is, or corresponds to, the transport start condition. That is, the facility controller H1 allows a transport operation by the stacker crane C to be started, when the transport start condition which includes a condition that the facility controller H1 is receiving the closed state signal is satisfied. Note that the transport start condition may include other condition or conditions in addition to the facility controller H1 receiving the closed state signal. These other conditions may include, for example, receiving of a transport start allowing command given by a worker, among other conditions.

Figure 5:
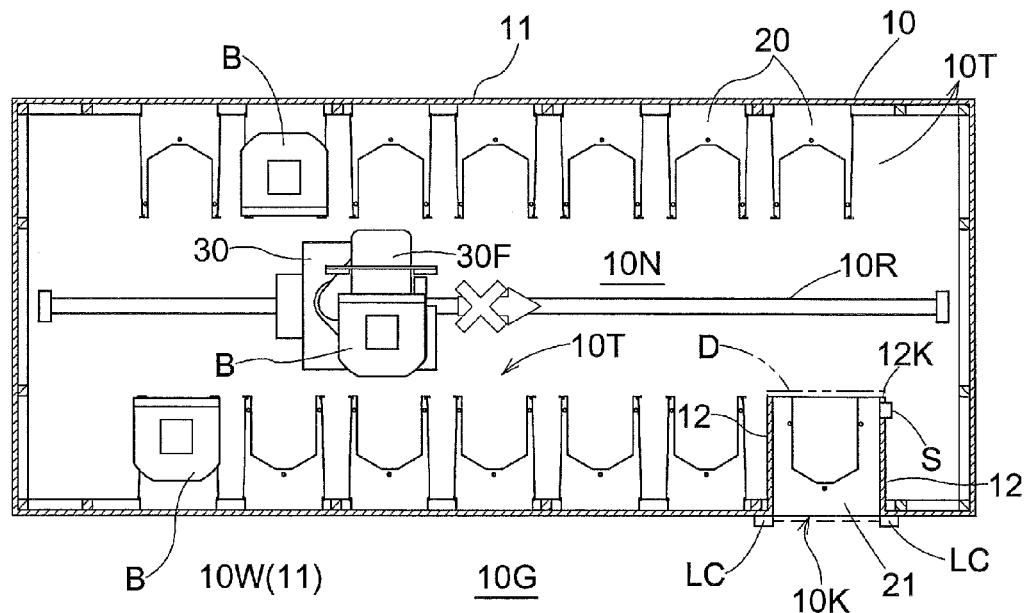
FIG. 5 is a plan view showing an emergency stop control.

The facility controller H1 determines whether the movement control has been completed based on a signal received from the movement controller H (Step #5). And if the facility controller H1 determines that the movement control is not completed ("No" at Step #5), it continues to determine whether the closed state signal it has been receiving from the open and closed state detector S is interrupted (Step #6). If the facility controller H1 determines that the closed state signal is not interrupted ("No" at Step #6), it returns to performing Step #5. If the facility controller H1 determines that the closed state signal is interrupted ("Yes" at Step #6), it performs an emergency stop control in which a signal for stopping the operation of each actuator of the stacker crane is transmitted to the movement controller H as shown in FIG. 5 (Step #7).

When the emergency stop control is started, the facility controller H1 notifies a worker of the emergency stop of the stacker crane C by means of an abnormal condition warning lamp, and/or an alarm sounding device (not shown), etc. The worker who learned of the emergency stop checks for, among other things, presence of any intruding object in the transport space 10N, and for any malfunction of the opening and closing member D to confirm that the abnormal condition has been cleared and then performs an operation to close the opening and closing member D. This operation can involve a manual closing of the opening and closing member D, or an inputting of command information that causes the opening and closing member D to be closed, into the facility controller H1.

Figure 6:
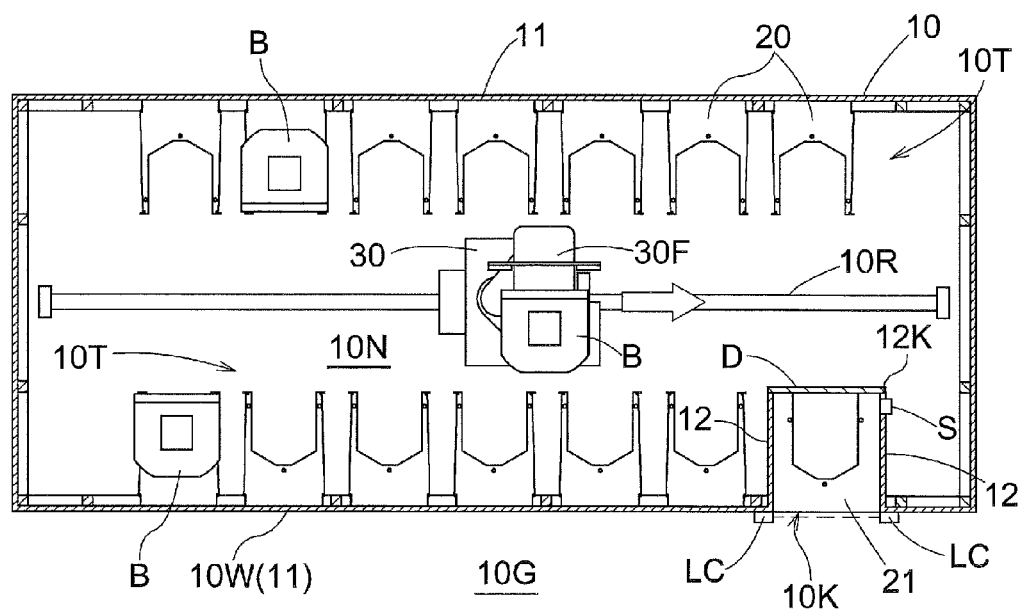
FIG. 6 is a plan view showing resumption of the movement control.

The emergency stop control is continued until the facility controller H1 detects that the resumption allowing signal is inputted by means of the allowing signal input unit Q (Step #8). Upon detecting that the resumption allowing signal has been inputted ("Yes" at Step #8), the facility controller H1 proceeds to determine whether it is receiving the closed state signal (Step #9), and returns to performing Step #2 to resume the movement control (See FIG. 6) if the facility controller H1 is receiving the closed state signal ("Yes" at Step #9).

In the present embodiment, the condition that the facility controller H1 detected the input of the resumption allowing signal and the condition that the facility controller H1 is receiving the closed state signal constitute the resuming condition.

That is, the facility controller H1 is configured to allow resumption of a transport operation by the stacker crane C after a transport operation by the stacker crane C has been suspended after it was started, if the resuming condition including receiving of the closed state signal is satisfied.

Note that the resuming condition does not have to be that both of these conditions are satisfied and may be that either one of these conditions is satisfied. In other words, for example, only the condition that the facility controller H1 has received the resumption allowing signal may be the resuming condition. Or, only the condition that the facility controller H1 is receiving the closed state signal may be the resuming condition. In addition, it is also possible to define the resuming condition such that additional one or more conditions need to be satisfied in addition to the aforementioned two conditions, in order for the resuming condition to be satisfied.

When the travel member 30 stops at the carrying-in-and-out stop position, the movement controller H transmits a movement control completion signal to the facility controller H1. When the facility controller H1 determines that the movement control is completed ("Yes" at Step #5), the facility controller H1 performs the LC enabling control which enables detection of any object to be detected by the light curtain LC (#10). From that point on, detection of any object to be detected by the light curtain LC is enabled till this flow of processes is terminated.

That is, the facility controller H1 is configured: to allow a transport operation by the stacker crane C to be started when the transport start condition, including that the controller is receiving the closed state signal, is satisfied; and to suspend the transport operation by the stacker crane C when the controller stops receiving the closed state signal after the transport operation by the stacker crane C is started; and to allow the transport operation of the stacker crane C to continue while the controller is receiving the closed state signal after the transport operation by the stacker crane C is started even if an object to be detected is detected by the light curtain LC.

Figure 7:
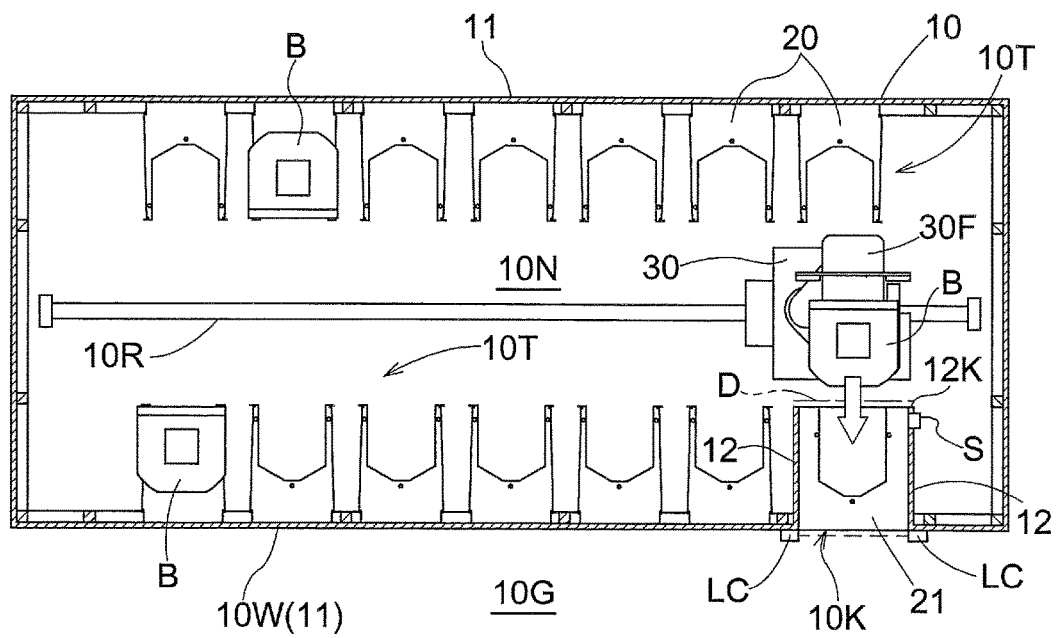
FIG. 7 is a plan showing a state in which a transfer control is started.
Figure 8:
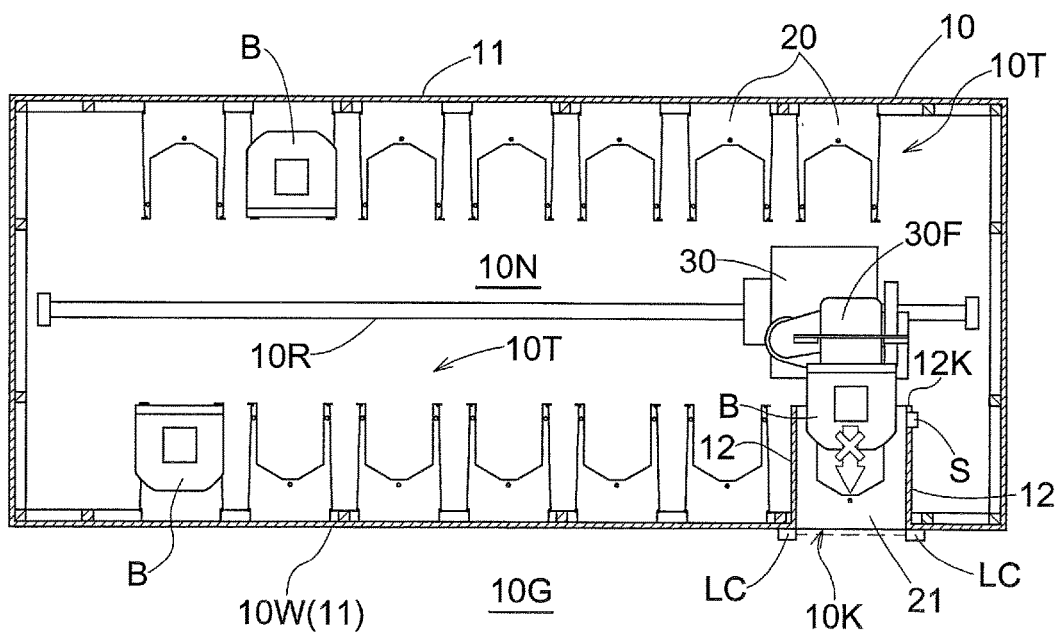
FIG. 8 is a plan view showing a state in which the transfer control is suspended.

Then, the facility controller H1 determines whether it is receiving the open state signal from the open and closed state detector S (Step #11). When the facility controller H1 is not receiving the open state signal, it suspends operation of the subsequent stacker crane C until it receives the open state signal ("No" at Step #11). When the facility controller H1 receives the open state signal ("Yes" at Step #11), the facility controller H1 transmits to the movement controller H a start signal for starting a transfer control which causes the transfer device 30Y to transfer a container B to or from the carrying-in-and-out support member 21 at the carrying-in-and-out transfer location (Step #12). This causes the transfer control to be started as shown in FIG. 7. The movement controller H determines whether the light curtain LC has detected any object to be detected (Step #13), and suspends the operation of the projecting and retracting actuator M3 to suspend the transfer control (Step #14) when an object is detected as shown in FIG. 8 ("Yes" at Step #13).

Figure 9:
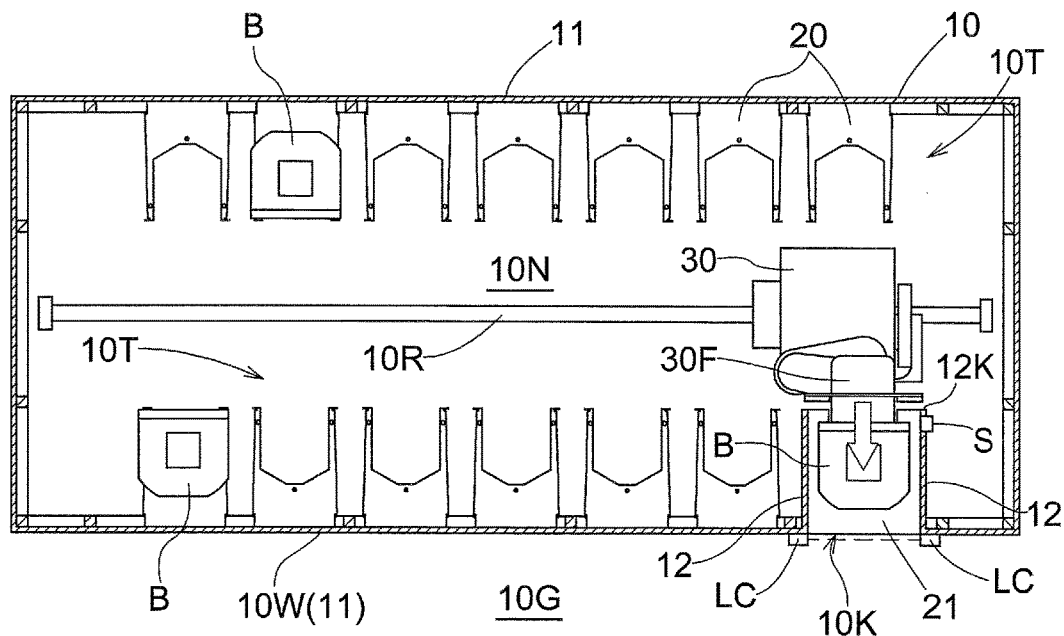
FIG. 9 is a plan view showing a state in which the transfer control is resumed.

In addition, with the transfer control suspended, the movement controller H determines whether the light curtain LC stopped detecting the object to be detected for a set period of time (Step #15). And when it stops detecting the object as shown in FIG. 9 ("Yes" at Step #15), the suspended transfer control is resumed (Step #16). The movement controller H causes the transfer device 30Y to operate until the transfer control is completed (Step #17), and transmits a signal indicating completion of the transfer control to the facility controller H1 upon completion of the transfer control.

Note that whether it stopped detecting an object to be detected for a set period of time (referred to as the detection interval) is determined in the determination made in Step #15. This is done to prevent a situation where transfer control is stopped and resumed repeatedly when an object to be detected moves in and out of the monitored area repeatedly in a short period of time. Note that the aforementioned detection interval may be set to any length of time. Alternatively, the transfer control may be resumed as soon as any object to be detected has stopped being detected, without setting the detection interval.

Figure 10:
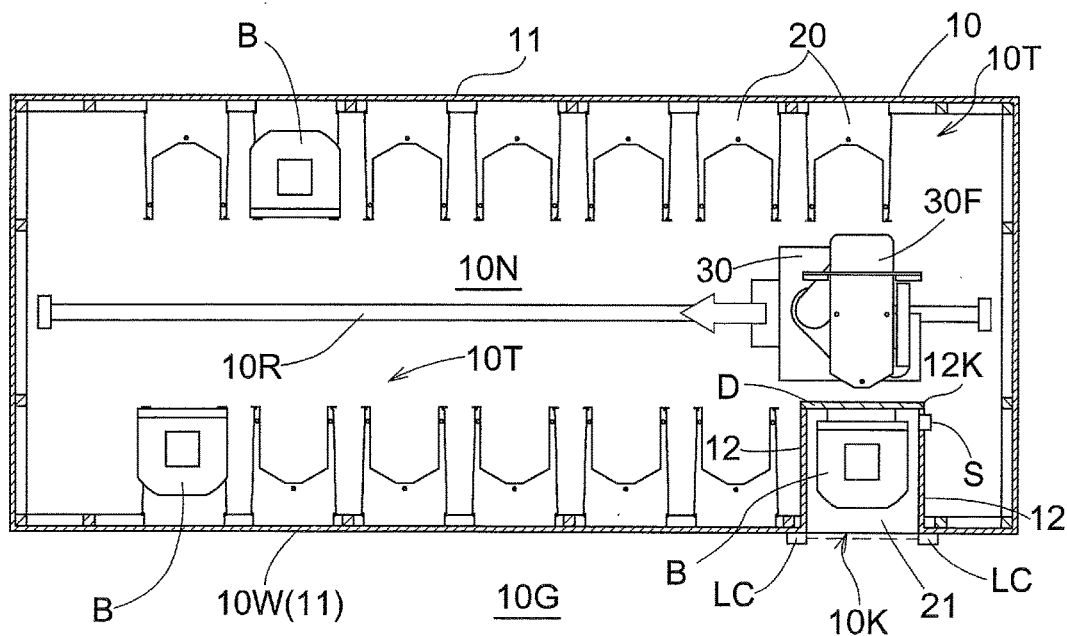
FIG. 10 is a plan view showing a state in which the movement control is started after completion of a transfer control.

When the transfer control is completed, the facility controller H1 places the opening and closing member D in the closed state, as shown in FIG. 10. If there is a subsequent transport command at this time, the flowchart of FIG. 4 is started anew.

That is, the controller is configured to suspend the transfer control if the light curtain LC detects any object to be detected while the transfer control is performed, and to resume the suspended transfer control if the light curtain LC stops detecting the object to be detected while the transfer control is suspended.

[Alternative Embodiments]

(1) In the embodiment described above, each article is a semiconductor container (container B) such as a FOUP, etc., for storing semiconductor substrates that are placed one above another. However, the articles are not limited to semiconductor containers. The present invention can be applied to any other kinds of articles such as loads placed on pallets, or cardboard boxes.

In addition, in the embodiment described above, an example is described in which the article transport device is a stacker crane C including a vertically movable member which is vertically movable along a vertical movement mast arranged vertically on a travel member 30. However, the article transport device is not limited to such structure. Instead, it may be, for example, a travel carriage which does not have a vertically movable member. Also, in the embodiment described above, an example is described in which a travel path is defined along the travel rail 10R installed on the floor surface and in which the travel member travels on the travel rail 10R. However, the travel path may be defined virtually. That is, the rail for guiding the travel member is not provided on the floor surface. And an autonomously travelling carriage may travel along a travel path stored in the movement controller H, etc. In this case, the travel path is defined such that the carrying-in-and-out transfer location is adjacent the opening.

In addition, in the embodiment described above, an example is described in which the travel path extends horizontally. However, the travel path may be a path that has a slope of 45 degrees or less, and more preferably 30 degrees or less, from the horizontal. In addition, the travel path may be a raising and lowering path which extends along the vertical direction, in which case, the path may have a slope of 45 degrees or less, and more preferably 30 degrees or less, from the vertical.

(2) In the embodiment described above, the opening and closing member D is located at a position that is recessed into the transport space 10N relative to the wall portion 10W along the width direction. However, the opening and closing member D may be located at a position close to or in the wall portion 10W along the width direction. In this case, the carrying-in-and-out transfer location may be projected into the work space 10G relative to the wall portion 10W.

In one arrangement of such carrying-in-and-out transfer location, it is conceivable to provide the carrying-in-and-out support member 21 on the side of the work space 10G relative to the wall portion 10W and to arrange the light curtain, for which the carrying-in-and-out transfer location is its monitored area, such that the light curtain can detect an object to be detected which enters the carrying-in-and-out transfer location from its perimeter.

In another arrangement of such carrying-in-and-out transfer location, for example, it is conceivable to provide a carry-in-and-out device (for example, a conveyor, or a carriage, etc.) which can transport an article between a position on the transport space 10N side and a position on the work space 10G side relative to the wall portion 10W, and which can offer and receive an article to and from the transfer device 30Y, and also to provide, on the work space 10G side relative to the work space 10G side end of the carry-in-and-out device, a monitoring detector, such as a light curtain, for detecting intrusion of any object to be detected.

(3) In the embodiment described above, an example is described in which the transfer device 30Y is a fork type equipped with the transfer support member 30F which supports a container B from below. However, the transfer device 30Y may be one that has a pair of clamps that hold an article therebetween.

(4) In the embodiment described above, the opening and closing member D is divided into two parts in the vertical direction; however, the opening and closing member D may be one opening and closing member that is continuous in the vertical direction. In addition, the opening and closing member D does not have to open in the vertical direction but may be opened and closed along the right and left direction. Here again, the opening and closing member D may be one opening and closing member that is continuous in the right and left direction, or may include two opening and closing members arranged along the right and left direction. In addition, the opening and closing member is described to be of a sliding type in the embodiments described above and shown in the drawings. However, the opening and closing member may be a pivoting door which pivots about one or more hinges, or may be of a rolling shutter type, etc. And as such, any one of various arrangements may be used as the opening and closing member as long as it can open and close the opening.

(5) In the embodiment described above, an example is illustrated in which the same member (the open and closed state detector S) functions as both the closed state detector and the open state detector; however, the closed state detector and the open state detector may be two separate members. In addition, in the embodiment described above, an example is described in which the open and closed state detector S is of a limit-switch type. However, for example, the open state and the closed state of the opening and closing member D may be detected by, among other things, detecting the presence of the opening and closing member D by means of a photoelectric type detector, or a reed switch which detects the open state and the closed state of the opening and closing member D by its proximity to or remoteness from a magnet attached to the opening and closing member D. As such, any one of various arrangements may be used as the open and closed state detector S.

(6) In the embodiment described above, an example is described in which the controller consists of the facility controller H1 fixedly provided near the semiconductor container storage 10 and the movement controller H provided in the stacker crane C; however, these controllers H1 and H may be combined into one controller. In this case, the single controller may be the one that is provided to the stacker crane C and that is given the functionality of the facility controller H1. Alternatively, the single controller may be the one that is fixedly provided near the semiconductor container storage 10 and that is given the functionality of the movement controller H.

(7) In the embodiment described above, an arrangement is described in which the monitoring detector is a light curtain LC provided on the side of the work space 10G relative to the entrance 10K and in which the monitored area is an area containing a portion in which the light curtain LC can detect any intruding object; however, the monitoring detector is not limited to such arrangement. For example, an imaging device which captures an image of an area on the work space 10G side of the entrance 10K may be provided. And the monitored area may be the imaging area of the imaging device so that the presence of an intruding object is detected based on the captured image of the monitored area.

Figure 4:
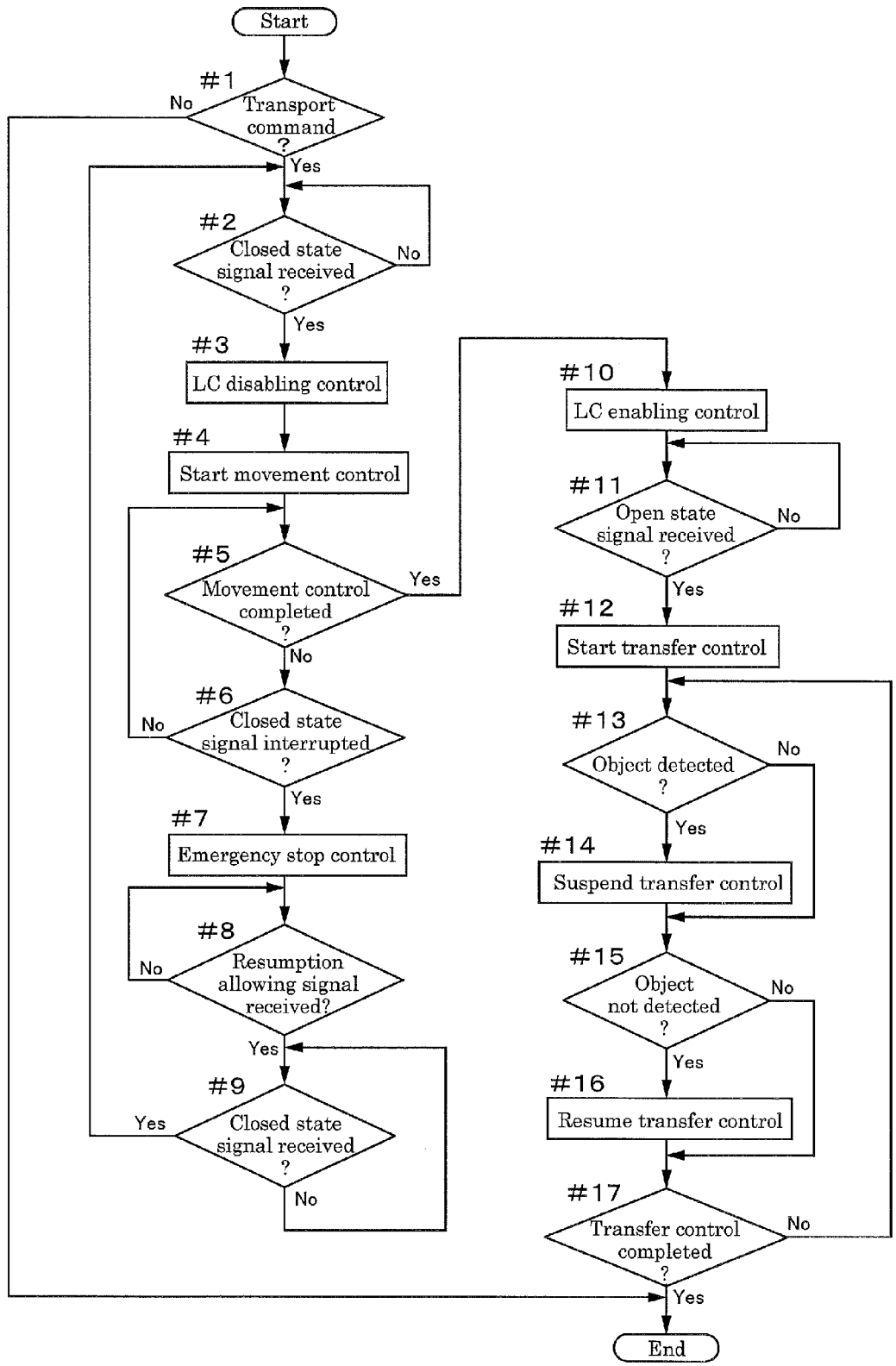
FIG. 4 is a flowchart showing control by a controller.

(8) In the embodiment described above, an arrangement is described in which the facility controller H1 disables detection of any object to be detected by light curtain LC in Step #2 in the flowchart of FIG. 4. However, without disabling detection of any object to be detected by light curtain LC, an alarm signal (sound, light, etc.) which warns of proximity to the object may be emitted when an object is detected. Even in such case, and even when an object is detected, the operation of the stacker crane C is continued if the closed state signal is received.

(9) In the embodiment described above, an arrangement is described in which the movement controller H resumes the suspended transfer control after suspending the transfer control in Step #14 in the flowchart of FIG. 4, if the light curtain LC stopped detecting any object to be detected. However, arrangement may be such that even when the light curtain LC stops detecting any object to be detected, transfer control may be resumed only after receiving a resumption allowing signal inputted by a worker.

(10) In the embodiment described above, an arrangement is described in which the wall portion 10W is one of the pair of wall portions (of the surrounding walls 11 that form a rectanble in plan view) that extend along the travel rail 10R. The wall portion 10W only needs to be one that extends along the travel path and that separates the transport space 10N and the work space 10G from each other. For example, both of the pair of wall portions may be used as partitions. And as such, any the number of partitions may be provided. Also, in the embodiment described above, an example is described in which the wall portion 10W is a part of wall portions of the surrounding walls 11 that form a rectangle in plan view. However, the surrounding walls do not have to form a rectangle and may be a triangle or of a polygonal shape having an equal number of sides as, or greater number of sides than, a pentagon. In addition, the surrounding walls may form a curve in plan view. Also in this case, the partition would be a part of the walls that extends along the travel path. In addition, in the embodiment described above, an example is illustrated in which the partition is a portion of the surrounding walls. However, the partition may be a wall that divides or separates an area for transporting from an area for a worker to work in. In this case, the area in which the article transport device moves is defined as the transport space. And area of the transport space that is other than the area where the partition is provided in plan view is preferably cordoned off from the area in which a worker performs work by means of intrusion preventing fences, etc.

[Summary of Embodiments Described above]

A brief summary of the article transport facility described above is provided next.

In light of the above, an article transport facility comprises: an article transport device configured to move along a travel path defined in transport space to transport an article; a partition for separating the transport space from work space for a worker to work and defined adjacent the transport space; an opening provided in the partition for allowing the work space and the transport space to communicate; an opening and closing member which can be switched between a closed state for closing the opening and an open state for leaving the opening open; a monitoring detector for detecting presence of an object to be detected that has entered an monitored area, the monitoring detector being provided at a position for monitoring the monitored area which is adjacent the opening and on a side of the work space relative to the opening along a direction along which the transport space and the work space are adjacent each other; a closed state detector which outputs a closed state signal when the opening and closing member is in the closed state; and a controller for controlling transport operation of the article transport device.

The controller: allows a transport operation by the article transport device to be started when a transport start condition which includes at least a condition that the controller is receiving the closed state signal is satisfied; and suspends the transport operation by the article transport device when the controller stops receiving the closed state signal after the transport operation by the article transport device is started; and allows the transport operation by the article transport device to continue while the controller is receiving the closed state signal after the transport operation of the article transport device is started even if the monitoring detector detects an object to be detected.

When the controller is not receiving the closed state signal, that is, when there is a possibility that the opening and closing member may no longer be in the closed state, there is a possibility that opening may be left open and an intruding object may enter the transport space through the opening. Because the transport operation by the article transport device is stopped when that happens, even if an intruding object enters the transport space through the opening during the transport operation by the article transport device, any incident of the entering intruding object interfering with or contacting the article transport device can be avoided. Note that when some member (e.g. controller) is not receiving the closed state signal, this includes a situation where the closed state signal is not outputted by the closed state detector due to a malfunctioning, etc., despite the fact that the opening and closing member is in the closed state.

In addition, when the controller is receiving the closed state signal, that is, when the opening and closing member is in the closed state, there is no possibility that an intruding object may enter the transport space through the opening. Thus, even if an object to be detected is detected by the monitoring detector, it would not be possible for the detected object to enter the transport space through the opening as an intruding object. Therefore, even after an object to be detected is detected by the monitoring detector, the safety of the facility is secured even if the transport operation by the article transport device is allowed to continue.

Thus, when the opening and closing member is in the closed state, by allowing the transport operation by the article transport device to be continued even if an object to be detected is detected by the monitoring detector, the transport operation by the article transport device would not be stopped more often than necessary. As a result, any decrease in the transporting efficiency of the article transport device can be reduced.

As such, the present invention can provide an article transport facility in which any decrease in transporting efficiency is reduced while ensuring the safety of the facility.

Here, the partition preferably extends along the travel path, wherein the article transport device preferably includes a travel member configured to move along the travel path and a transfer device which moves with the travel member and which is configured to transfer a container to and from a transfer target location located laterally along a width direction which is perpendicular to the traveling direction of the travel member, wherein the transfer device preferably includes an article support member for supporting an article such that the article support member can be retracted and projected along the width direction between a retracted position that overlaps with the travel member in plan view and projected position displaced laterally of the travel path and along the width direction, relative to the retracted position, wherein the article transport device is preferably configured to transfer a container to and from the transfer target location with a projecting and retracting operation of the transfer support member to and from the transfer target location, with the travel member stopped, wherein, as the transfer target location, a carrying-in-and-out transfer location is preferably defined on a side of the work space along the width direction and adjacent the opening, wherein an open state detector is preferably provided which outputs an open state signal when the opening and closing member is in the open state, wherein the controller is preferably configured to perform an opening control, a closing control, a movement control, and a transfer control, wherein the opening control is preferably a control for switching the opening and closing member from the closed state to the open state, wherein the closing control is preferably a control for switching the opening and closing member from the open state to the closed state, wherein the movement control is preferably a control for causing the travel member to travel along the travel path to a carrying-in-and-out stop position defined in the travel path as a stop position of the travel member when transferring an article to or from the carrying-in-and-out transfer location by means of the transfer device, wherein the transfer control is preferably a control for causing the transfer device to transfer the article to or from the carrying-in-and-out transfer location with the travel member stopped at the carrying-in-and-out stop position and with the controller receiving the open state signal, and wherein the controller is preferably configured to suspend the transfer control if, while the transfer control is performed, the monitoring detector detects an object to be detected, and to resume the transfer control that has been suspended if, while the transfer control is suspended, the monitoring detector stops detecting the object to be detected.

The carrying-in-and-out transfer location is adjacent the opening on the work space side. Thus, when transferring an article to or from the carrying-in-and-out transfer location, the article support member of the transfer device may project into the monitored area on the work space side of the opening.

In the present invention, the transfer operation is suspended if the monitoring detector detects an object to be detected while the transfer device is performing the projecting or retracting operation. Thus, for example, even if a body part of the worker working in the work space inadvertently enters the monitored area while the transfer device is performing the projecting and retracting operation, the operation of the transfer device can be stopped by the virtue of the fact that the monitoring detector detects the body part as an object to be detected; thus, interference or contact between the transfer device in a projecting and retracting operation and other objects, such as a worker, can be prevented.

In addition, the transfer device automatically resumes the projecting and retracting operation when safety is reestablished, for example, because the body part of the worker that has entered the monitored area leaves the monitored area; thus, it does not have to take a long time to resume the movement control compared with the system in which a worker must enter a command to issue a resumption allowing signal.

Thus, an article transport facility can be provided in which any decrease in transporting efficiency is reduced while ensuring the safety of the facility.

Here, after suspending a transport operation by the article transport device after the transport operation by the article transport device is started, the controller preferably allows resumption of the transport operation by the article transport device if a resuming condition, which includes a condition that the closed state signal is received, is satisfied.

That is, because the transport operation by the article transport device is resumed if the opening and closing member is in the closed state, interference or contact between any intruding object that has entered from the opening and the travel member can be properly prevented upon resuming of the transport operation.

DESCRIPTION OF REFERENCE NUMERALS AND SYMBOLS

10G Work space
10K Opening
10N Transport space
10R Travel rail (Travel path)
10W Partition
21 Carrying-in-and-out support Member (Carrying-in-and-out transfer location)
30 Travel member
30F Transfer support member
30Y Transfer device
B Container (Article)
C Stacker crane (Article transport device)
D Opening and closing member
H Movement controller (Controller)
H1 Facility controller (Controller)
LC Light curtain (Monitoring detector)
S Open and closed state detector (Closed state detector, Open state detector)

What is claimed is:
1. An article transport facility comprising:
an article transport device configured to move along a travel path defined in a transport space to transport an article;
a partition for separating the transport space from a work space for a worker to work; said partition is defined adjacent the transport space;
an opening provided in the partition for allowing the work space and the transport space to communicate;
an opening and closing member that can be switched between a closed state for closing the opening and an open state for leaving the opening open;
a monitoring detector for detecting presence of an object that has entered a monitored area, the monitoring detector being provided at a position in the monitored area that is adjacent the opening and, said monitoring detector is located on a side of the work space relative to the opening along a direction where the transport space and the work space are adjacent to each other;
a closed state detector for outputting a closed state signal when the opening and closing member is in the closed state;
a controller for controlling the transport operation of the article transport device; and
wherein the controller:
allows a transport operation by the article transport device to be started when a transport start condition is satis- fied, wherein the transport start condition includes at least a condition that the controller is receiving the closed state signal; and suspends the transport operation when the controller stops receiving the closed state signal after the transport operation by the article transport device is started; and the controller allows the transport operation to continue while receiving the closed state signal even when the monitoring detector detects an object to be detected.

2. The article transport facility as defined in claim 1, wherein the partition extends along the travel path, wherein the article transport device includes a travel member configured to move along the travel path and a transfer device which moves with the travel member, said travel member is configured to transfer a container to and from a transfer target location, said transfer target location is located laterally along a width direction which is perpendicular to the traveling direction of the travel member, wherein the transfer device includes an article support member for supporting an article such that the article support member can be retracted and projected along the width direction between a retracted position and a projected position, wherein, in said retracted position, the article support member overlaps with the travel member in a plan view, and, in the projected position, the article support member is displaced laterally of the travel path and along the width direction, relative to the retracted position, wherein, when the travel member is stopped, the article transport device is configured to transfer a container to and from the transfer target location with a projecting and retracting operation of the article support member to and from the transfer target location, wherein, as the transfer target location, a carrying-in-and-out transfer location is defined on a side of the work space along the width direction and adjacent the opening, wherein an open state detector is provided for outputting an open state signal when the opening and closing member is in the open state, wherein the controller is configured to perform an opening control, a closing control, a movement control, and a transfer control, wherein the opening control is a control for switching the opening and closing member from the closed state to the open state, wherein the closing control is a control for switching the opening and closing member from the open state to the closed state, wherein the movement control is a control for causing the travel member to travel along the travel path to a carrying-in-and-out stop position defined in the travel path, said carrying-in-and-out stop position is a stop position of the travel member when transferring an article to or from the carrying-in-and-out transfer location by the transfer device, wherein the transfer control is a control for causing the transfer device to transfer the article to or from the carrying-in-and-out transfer location, wherein the travel member stopped at the carrying-in-and-out stop position, and the controller receives the open state signal, and wherein the controller is configured to suspend the transfer control if, while the transfer control is performed, the monitoring detector detects an object to be detected, and wherein the controller resumes the transfer control that has been suspended if the monitoring detector stops detecting the object to be detected while the transfer control is suspended.

3. The article transport facility as defined in claim 1, wherein after suspending a transport operation by the article transport device, the controller allows resumption of the transport operation by the article transport device if a resuming condition is satisfied, said resuming condition occurs when the closed state signal is received.

4. The article transport facility as defined in claim 2, wherein after suspending a transport operation by the article transport device, the controller allows resumption of the transport operation by the article transport device if a resuming condition is satisfied, said resuming condition occurs when the closed state signal is received.

* * * * *